United States Patent [19]

Rao

[11] 4,339,766

[45] Jul. 13, 1982

[54] DUMMY COLUMNS FOR REDUCING PATTERN SENSITIVITY IN MOS/LSI DYNAMIC RAM

[75] Inventor: G. R. Mohan Rao, Houston, Tex.

[73] Assignee: Texas Instruments Incorporated, Dallas, Tex.

[21] Appl. No.: 83,927

[22] Filed: Oct. 11, 1979

[51] Int. Cl.³ .................... H01L 27/02; H01L 29/78; G11C 11/24
[52] U.S. Cl. ........................................ 357/41; 357/23; 365/149
[58] Field of Search .............. 357/41, 23 C; 307/238; 365/149

[56] References Cited

U.S. PATENT DOCUMENTS

| | | | |
|---|---|---|---|
| 4,112,508 | 9/1978 | Itoh | 307/238 |
| 4,118,794 | 10/1978 | Mizuno et al. | 307/238 |
| 4,198,697 | 4/1980 | Kuo et al. | 307/238 |

Primary Examiner—Gene M. Munson
Attorney, Agent, or Firm—John G. Graham

[57] ABSTRACT

An MOS/LSI type dynamic RAM with single 5V supply and grounded substrate employs a pair of dummy columns on each end of the cell array to prevent pattern sensitivity in testing. The dummy columns have capacitors which alternate between large and small so a given cell will always read a "1" or "0" upon refresh. These cells are not accessed in normal read or write cycles. Thus, regardless of the row addressed, one column line half on each side will go high and the other low. This shields the ends of the array from diffusing electrons (minority carriers).

5 Claims, 6 Drawing Figures

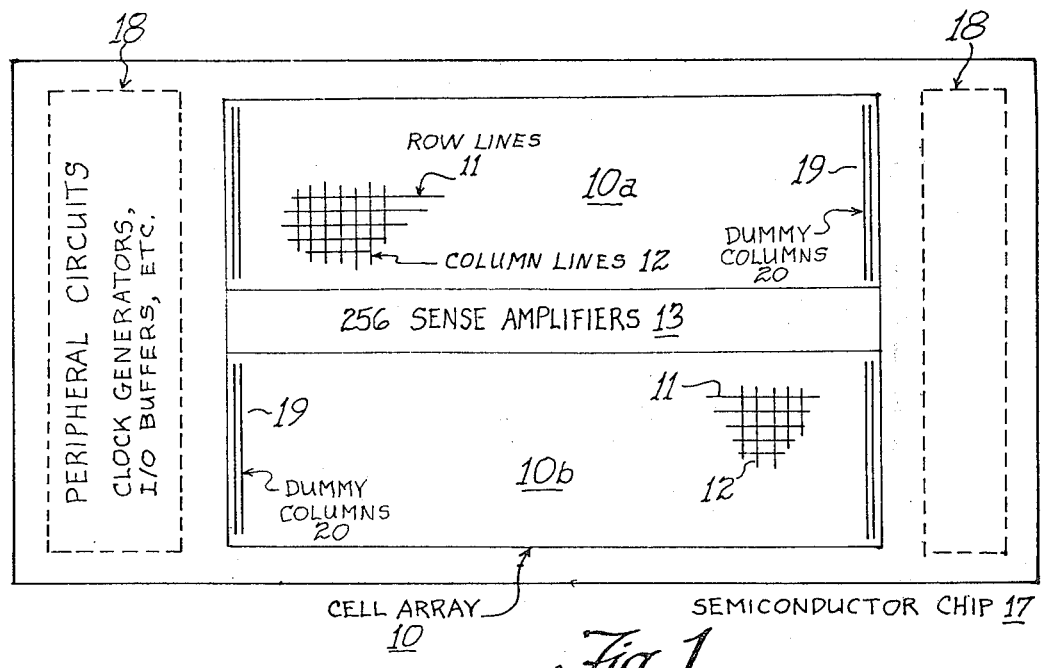
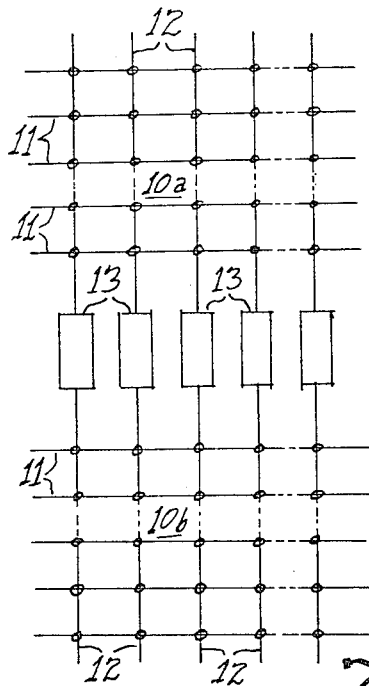
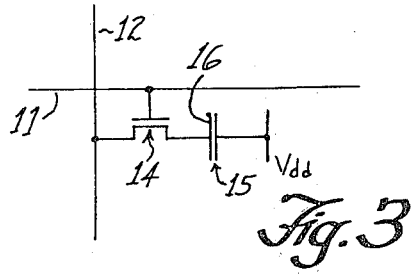
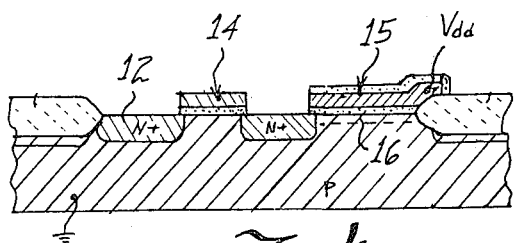

DUMMY COLUMNS FOR REDUCING PATTERN SENSITIVITY IN MOS/LSI DYNAMIC RAM

BACKGROUND OF THE INVENTION

This invention relates to semiconductor devices and more particularly to a technique for preventing pattern sensitivity in a dynamic RAM type of memory device.

Manufacture is well underway of MOS/LSI type dynamic memory devices having 64K bit density and a single 5 V supply as described in Electronics, Sept. 28, 1978, pp. 109,116 Single 5 V supply dynamic RAMS offer substantial advantages over the previous generations of three-supply dynamic RAMs, such as the 4027 and 4116 devices, in the areas of reduced power dissipation, easier PC board layout, total TTL compatability, etc. However, the −5 V substrate supply used in these prior 4K and 16K dynamic RAMs not only provided an adjusted internal threshold voltage for input TTL compatability but also protected the internal nodes from ever being forward biased whenever significant current transients occur—it is not uncommon for dynamic RAMs to exhibit 50 to 100 MA transients. Huge transients in high performance devices almost precludes the use of on-chip substrate bias generators because these circuits can supply at best several hundred microamps. Consequently, devices as described in the above-mentioned Electronics article use a grounded substrate so as not to compromise the speed of the part as would be necessary if an on-chip substrate bias were employed.

With all its advantages, grounded substrate bias has one disadvantage: unless adequate protection is made on all nodes, there is a possibility that minority carriers injected into the substrate will diffuse to the areas of the storage capacitors and discharge these nodes which store charge dynamically. This condition can cause failure upon testing the device after manufacture; the test patterns are indeed much more stringent than occur in normal operation. Patterns of "1's" and "0's" are written in and read out to detect "pattern sensitivity." An extremely tough pattern that is normally used in testing by manufacturers and users of dynamic RAMs is called "refresh disturb," as will be later described.

It is the principal object of this invention to provide an improved semiconductor memory device and method of manufacture. Another object is to provide improved dynamic RAM devices which have single 5 V supply and no substrate bias, particularly such devices which do not exhibit pattern sensitivity upon testing.

SUMMARY OF THE INVENTION

In accordance with one embodiment of the invention, an MOS/LSI type dynamic RAM with single 5 V supply and grounded substrate employs a MOS/LSI type dynamic RAM with single 5 V supply and grounded substrate employs a pair of dummy columns on each end of the cell array to prevent pattern sensitivity in testing. The dummy columns have capacitors which alternate between large and small (relative to the reference dummy cell of the type described in U.S. Pat. No. 4,081,701 issued to Redwine et al, assigned to Texas Instruments) so a given cell will always read a "1" or "0" upon refresh. These cells are not accessed in normal read or write cycles. Thus, regardless of the row addressed, one column line half on each side will go high and the other low, thus compensating localized substrate transients. This shields the ends of the array from diffusing electrons.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

FIG. 1 is a plan view of an MOS/LSI semiconductor memory chip having the dummy columns of the invention;

FIG. 2 is an electrical diagram in schematic form of parts of the memory system in the chip of FIG. 1;

FIG. 3 is an enlarged view of part of the electrical diagram of FIG. 2, showing a single memory cell;

FIG. 4 is an elevation view in section of a very small part of the semiconductor substrate or chip of FIG. 1 showing the memory cell of FIG. 3 as constructed in semiconductor integrated circuit form.

DETAILED DESCRIPTION OF SPECIFIC EMBODIMENT

Figure 5:
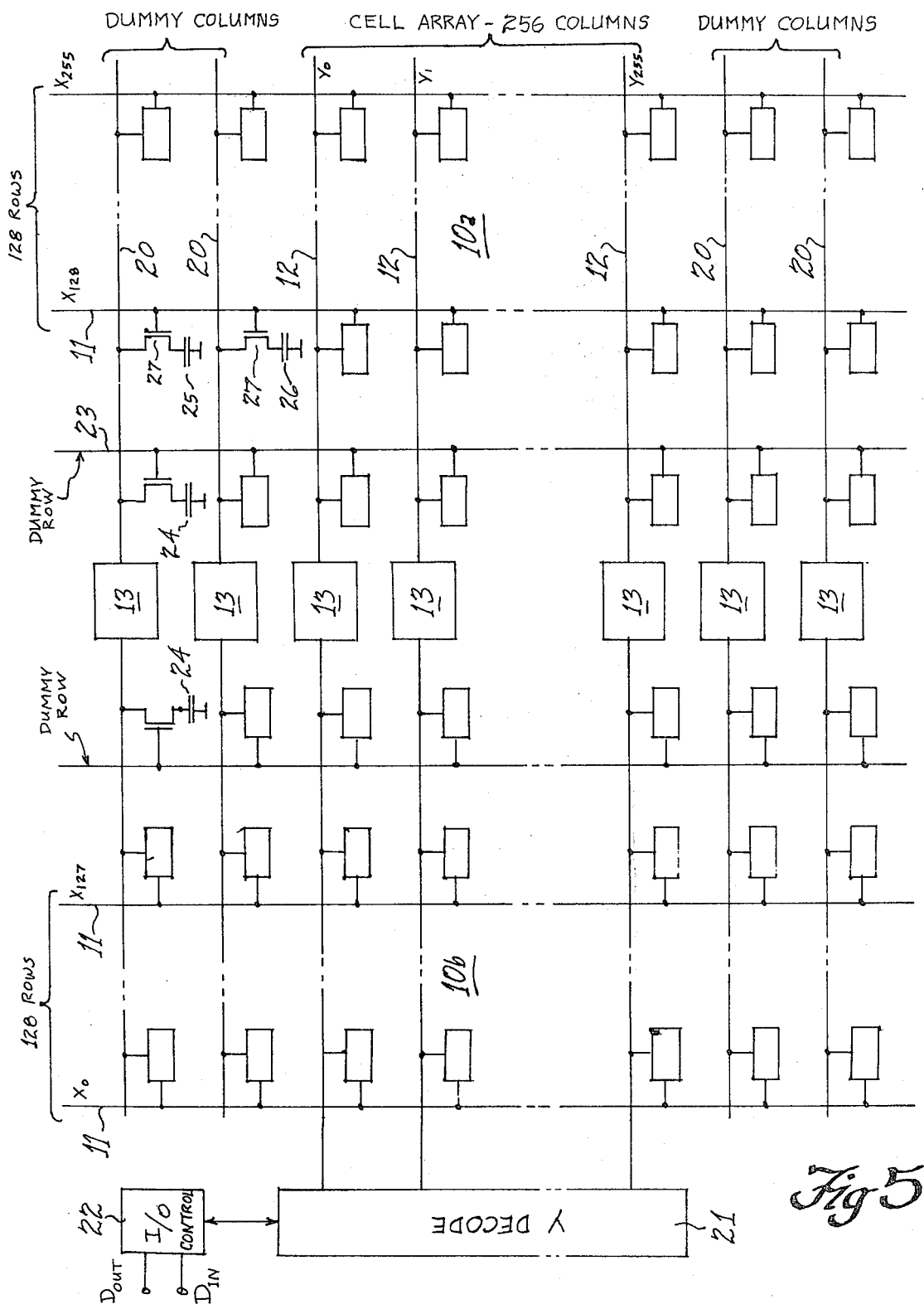
FIG. 5 is an electrical schematic diagram of the cell array of the memory device of FIGS. 1 and 2.

Referring to FIGS. 1, 2, 3 and 4, a semiconductor memory device is shown may use the concept of the invention. The memory device in this example is a 64K bit dynamic RAM as described in Electronics magazine, Sept. 28, 1978, pp. 109–116, or a device of similar construction; many different dynamic RAM devices of this general type are currently manufactured by companies in the semiconductor industry. The memory device includes an array 10 of "64K" or 65,536 one-transistor memory cells arranged in generally 256 rows 11 and 256 columns 12 but split into two array halves 10a and 10b containing 32,768 cells each. A set of 256 sense amplifiers 13 is positioned in the center of the array; each sense amplifier is a bistable circuit with differential inputs connected to column line halves as set forth in U.S. Pat. No. 4,081,701 issued to White, McAdams and Redwine, or pending application Ser. No. 944,822, filed Sept. 22, 1978, by McAlexander, White and Rao, both assigned to Texas Instruments.

Each cell in the array 10 includes a transistor 14 and a capacitor 15 constructed as in pending application Ser. No. 648,594 filed Jan. 12, 1976, by C-K Kuo, assigned to Texas Instruments. In this type of cell a stored logic "0" is the presence of minority carriers (in this case electrons) in an inverted storage region 16 which is one plate of the capacitor 15, while a stored logic "1" is the absence of minority carriers in the region 16 for the cell. During normal operation of the dynamic RAM the column line half 12 on either side of each sense amplifier 13 is precharged to a high voltage (approximately Vdd or 5 V) and, depending upon the signal level sensed for the cell for this column in the addressed row, a column line half will be either discharged to Vss (if "0" detected while the other side remains at Vdd, or held high (if "1" detected) while the other side is discharged to Vss. Hence either in precharge or in active operation, 256 of the column line halves 12 will always have to be brought from Vss to Vdd or discharged from Vdd to Vss, respectively. Assuming approximately 0.6 pf column line capacitance, it is seen that a substantial amount of capacitive coupling to the substrate 17 exists due to the interaction of the bit lines. This is one source of minority carrier generation in the substrate.

Another source of minority generation is in the end regions 18 of the substrate 17. In a dynamic RAM of this type most of the clock circuitry peripheral to the array is purely dynamic, and every time a gate is discharged a significant number of electrons are dumped back into the substrate 17. Some of these are collected by nodes at potential greater than Vss, and others recombine spontaneously. For typical silicon the lifetime is 40 to 50 microseconds; electrons can easily travel 10 mils before their number decreases by a factor of approximately 2.6—the classical diffusion length. The substrate 17 as seen in FIG. 1 has dimensions of about 180×110 mils, so electrons generated in clock circuits or the like in the ends 18 will reach the outer columns of cells in the array 10. The cells along the column lines 12 at the outer ends of the array are very susceptible while storing "1's" since diffusing electrons will be attracted to the area 16 of a cell by Vdd on the upper plate of the capacitor and may build up to a "0" or at least a soft "1."

An example of a phenomena observed in testing is as follows: (1) write background of "1's" in all cells in the array 10; (2) select one row 11 and repeatedly write "0's" in that row for one complete refresh period or approximately 4 ms; (3) read out the array. The "1's" in the columns 12 along the ends 19 are found to be substantially degraded. By repeatedly writing "0's" the discharging column lines are confined to only one array half 10a or 10b. This test sequence is repeated for a row 11 on the other side of the sense amplifiers 13 and the phenomena is duplicated. Because of the shape of the pattern of errors detected, this is referred to as a "goal post" failure, one example of pattern sensitivity.

The memory array 10 includes in this example 256 column lines 12 and 256 row lines 11, a representative sample of which are shown in FIG. 5. Each column line has a sense amplifier 13 at its center. Two dummy columns 20 are positioned at each end of the array; the dummy columns are like the columns 12 in the data memory array except for the capacitor sizes in the cells and the fact that the dummy column lines are not connected to a Y decoder 21 and an I/O circuit 22. In the data array 10, each cell consists of a transistor 14 and a capacitor 15, with the gates of all transistors in each row being connected to a row line 11 and the drains of all transistors in each column being connected to a column line 12. A dummy row line 23 is positioned on each side of the sense amplifiers according to standard practice. When a memory cell in array half 10a in one side of the sense amplifiers is addressed, then the row 23 of dummy cells on the opposite side is activated and vice versa, as is conventional.

Figure 6:
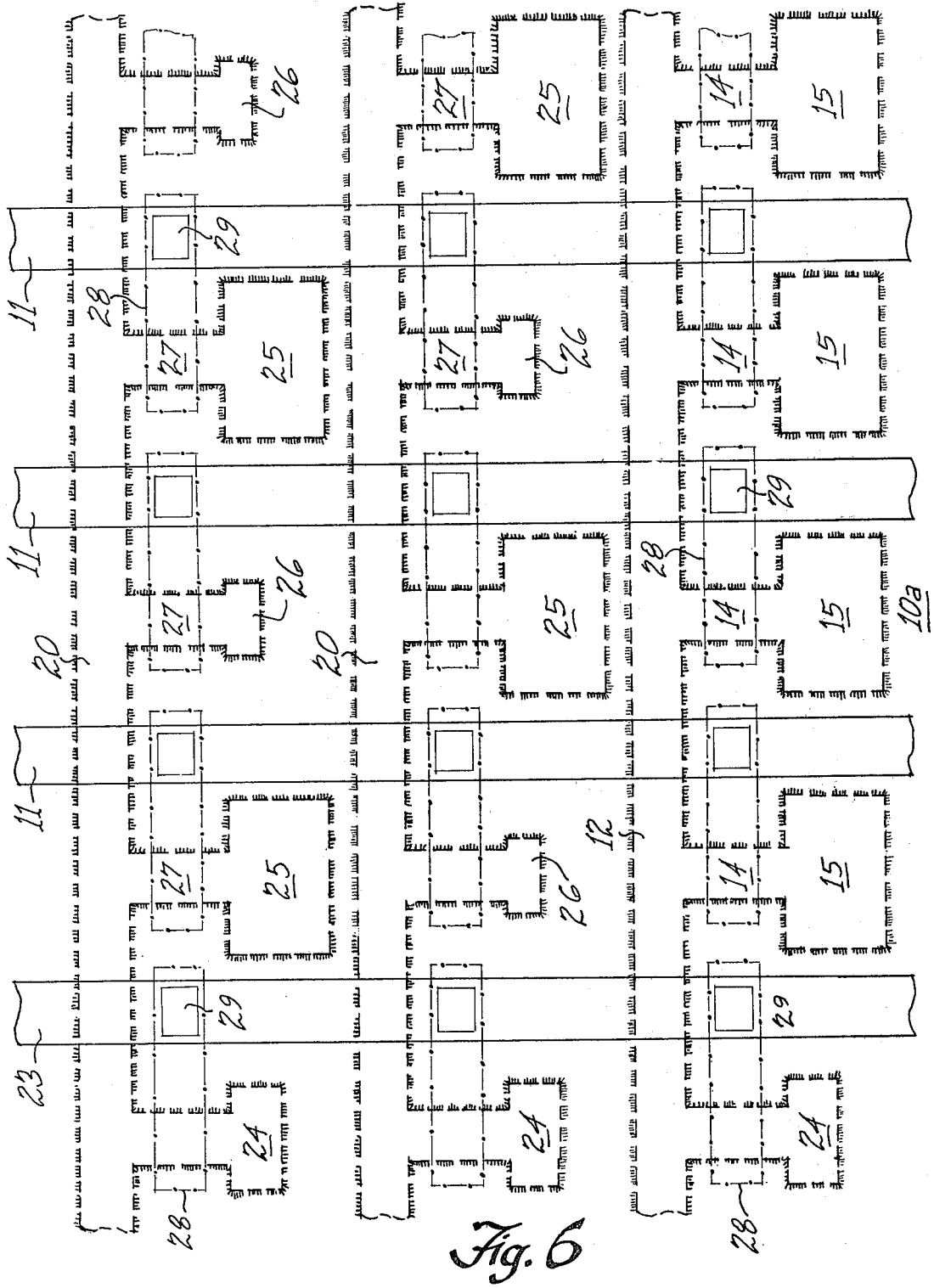
FIG. 6 is an enlarged view of a very small part of the semiconductor chip of FIG. 1, showing the layout of a part of FIG. 5.

According to the invention, the capacitors for the cells in the dummy columns 2 are of alternating and interleaved large and small sizes relative to a reference dummy cell, see FIG. 6. A standard cell capacitor 15 is of a given size selected for maximum storage capacitance consistent with high density layout. The dummy cells in the rows 23 have capacitors 24 which are about one-third the size of the capacitors 15 of the standard cells. The cells of the dummy columns, however, have two sizes; half of these cells have capacitors 25 which are full size and the other half have capacitors 26 which are very small, perhaps one-tenth or one-eight full size, i.e., significantly smaller than the dummy cell capacitors 24 (perhaps one-third the size of the dummy cell capacitors). The access transistors 27 for the dummy columns 20 are exactly the same as the transistors 14 for the standard columns 12 in the memory array or transistors 28 for the dummy cells. Segments 28 of polysilicon form the gates of the transistors 14, 27 or 28 and also are connected to metal lines 11 or 23 by metal-to-poly contacts 29. A strip of polysilicon (not shown) overlies each column of capacitors and is connected to Vdd at the end of each column, functioning to invert the regions 16 under this strip for each capacitor.

When a given row 11 is addressed, this row line goes to Vdd and all the other row lines 11 are held at Vss; the dummy row 23 goes high on the other side of the sense amplifiers while the row 23 on the same side stays at Vss. The column lines 12 and dummy columns 20 are always precharged to near Vdd by the sense amplifiers 13 during the precharge period before an active cycle. Thus one of the two lines 20 will discharge a minute amount, into a large capacitor 25 and the other into a small capacitor 26; the sizes of these capacitors 25,26 relative to the dummy row capacitors 24 are such that one of the sense amplifiers 13 will see a 1, the other a zero for the dummy columns. Thus, in a refresh pattern where the rows are addressed sequentially, for example, the dummy columns 20 on the ends of the array will alternate 1—0—1—0—1—0, etc., rather than always presenting the same logic levels. This effectively shields the data in interior columns 12 for the memory array from the effects of minority carriers. If a whole array half has a pattern of all "1's" being continuously refreshed, it is assured that there is one column of "0's" on each end to collect carriers before they get to the data.

The same concepts are of course applicable to single-ended rather than split arrays. That is, the sense amplifiers may be positioned on one side of the column lines rather than at the center. Also, if a sense amplifier is shared by several column lines, then the sense amplifiers for the dummy columns are separated from those for the data array. It is also understood that a number of dummy columns other than two may be employed.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising an array of rows and columns of memory cells in a face of a semiconductor body, means for accessing data in said array, peripheral circuitry in said face spaced from the array, and a pair of dummy columns positioned in said face at each end of the array between the array and said circuitry to prevent diffusion of minority carriers from said circuitry to the memory, the dummy columns comprising a plurality of memory cells similar to that in said array of memory cells, said means for accessing not being connected to said dummy columns, each dummy column comprising a plurality of one-transistor cells having alternating large and small capacitors.

2. A device according to claim 1 wherein adjacent dummy columns have large and small cells of opposite size in adjacent positions.

3. In a semiconductor memory device of the type having an array of rows and columns of memory cells in a face of a semiconductor body and peripheral circuitry in said face spaced from the array, a method of preventing minority carriers generated in the peripheral circuitry of the semiconductor memory array from reaching said memory cells in the array, comprising storing alternately "1's" and "0's" in cells of a pair of adjacent columns of said memory cells which are positioned at edges of the array nearest the peripheral circuitry, and repeatedly refreshing said "1's" and "0's" in the same cell positions in said adjacent columns during operating read or write cycles of said memory without accessing data in the cells of said pair of adjacent columns.

4. A method according to claim 3 wherein the step of repeatedly refreshing in said cells of said pair of adjacent columns includes storing only one logic state of "1" or "0" in a given cell.

5. A method according to claim 4 wherein the step of repeatedly refreshing includes the step of storing opposite logic states in cells which are adjacent one another in different ones of the pair of adjacent columns.

* * * * *